(12) United States Patent  
Akhter et al.

(10) Patent No.: US 9,369,149 B1  
(45) Date of Patent: Jun. 14, 2016

(54) METHOD AND APPARATUS FOR EFFICIENT BASEBAND UNIT PROCESSING IN A COMMUNICATION SYSTEM

(75) Inventors: Mohammad Shahanshah Akhter, Ottawa (CA); Brian Scott Darnell, Suwanee, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 263 days.

(21) Appl. No.: 13/609,127

(22) Filed: Sep. 10, 2012

Related U.S. Application Data

(60) Provisional application No. 61/642,424, filed on May 3, 2012, provisional application No. 61/642,322, filed on May 3, 2012.

(51) Int. Cl.  
*H04W 88/08* (2009.01)  
*H03M 7/30* (2006.01)

(52) U.S. Cl.  
CPC .............. *H03M 7/30* (2013.01); *H04W 88/085* (2013.01)

(58) Field of Classification Search  
None  
See application file for complete search history.

(56) References Cited

U.S. PATENT DOCUMENTS

| | | | |
|---|---|---|---|
| 5,999,561 A | 12/1999 | Naden et al. | |
| 6,192,259 B1 | 2/2001 | Hayashi | |
| 6,226,325 B1 | 5/2001 | Nakamura | |
| 6,240,084 B1 * | 5/2001 | Oran et al. | 370/352 |
| 6,263,503 B1 | 7/2001 | Margulis | |
| 6,449,596 B1 | 9/2002 | Ejima | |
| 6,728,778 B1 | 4/2004 | Brennan et al. | |
| 6,775,530 B2 | 8/2004 | Severson et al. | |
| 6,842,623 B2 | 1/2005 | Koskal | |
| 6,903,668 B1 | 6/2005 | Drorr et al. | |
| 7,009,533 B1 | 3/2006 | Wegener | |
| 7,088,276 B1 | 8/2006 | Wegener | |
| 7,142,519 B2 | 11/2006 | Saadeh et al. | |
| 7,519,383 B2 | 4/2009 | Olgaard | |

(Continued)

FOREIGN PATENT DOCUMENTS

| | | |
|---|---|---|
| KR | 20080056360 | 6/2008 |
| WO | 2005048625 A1 | 5/2005 |

(Continued)

OTHER PUBLICATIONS

CPRI Specification V4.1, Commmon Public Interlace (CPRI); Interface Specification, Feb. 1, 2009, 75 pages.

(Continued)

*Primary Examiner* — Gregory Sefcheck  
*Assistant Examiner* — Jenkey Van  
(74) *Attorney, Agent, or Firm* — Glass & Associates; Molly Sauter; Kenneth Glass

(57) ABSTRACT

The method and apparatus of the present invention provides for reduced power consumption and cost while supporting wide bandwidth signals from a large number of antennas, as is required by next generation systems. In accordance with the present invention, a method and apparatus are provided for processing data in a baseband unit in which compressed signals from remote radio units are sent directly to the switch instead of to a separate conversion device. Thereby, the local input and output bottleneck within processing devices is removed in the data path of the signals between the remote radio units and the baseband unit. This also reduces the number of ports in the switch and bandwidth requirement for the switch.

16 Claims, 9 Drawing Sheets

(56) References Cited

U.S. PATENT DOCUMENTS

| | | | |
|---|---|---|---|
| 7,541,950 | B2 | 6/2009 | Wegener |
| 7,564,861 | B1 | 7/2009 | Barani Subbiah |
| 7,599,283 | B1 | 10/2009 | Varnier et al. |
| 7,623,894 | B2 | 11/2009 | Vaglica et al. |
| 7,656,897 | B2 | 2/2010 | Liu |
| 7,680,149 | B2 | 3/2010 | Liu et al. |
| 7,706,477 | B2 | 4/2010 | Larsson |
| 7,835,435 | B2 | 11/2010 | Soni et al. |
| 7,852,797 | B2 | 12/2010 | Kang et al. |
| 7,899,410 | B2 | 3/2011 | Rakshani et al. |
| 7,924,929 | B2 | 4/2011 | Meenakshisundaram et al. |
| 7,930,436 | B1 | 4/2011 | Znosko |
| 7,961,807 | B2 | 6/2011 | Kotecha et al. |
| 8,005,152 | B2 | 8/2011 | Wegener |
| 8,018,910 | B2 | 9/2011 | Jiang et al. |
| 8,054,889 | B2 | 11/2011 | Isu et al. |
| 8,089,854 | B2 | 1/2012 | Persico |
| 8,108,910 | B2 | 1/2012 | Conner, II et al. |
| 8,165,100 | B2 | 4/2012 | Sabat et al. |
| 8,174,428 | B2 | 5/2012 | Wegener |
| 8,176,524 | B2 | 5/2012 | Singh et al. |
| 8,239,912 | B2 | 8/2012 | Deng |
| 8,340,021 | B2 | 12/2012 | Okeeffe et al. |
| 8,825,900 | B1 * | 9/2014 | Gross, IV ............... H04L 47/31 709/238 |
| 9,047,669 | B1 | 6/2015 | Jean-Jaques Ostiguy |
| 9,055,472 | B2 | 6/2015 | Evans et al. |
| 9,059,778 | B2 | 6/2015 | Yi Ling |
| 2002/0055371 | A1 | 5/2002 | Amon et al. |
| 2002/0136296 | A1 | 9/2002 | Stone |
| 2002/0163965 | A1 | 11/2002 | Lee et al. |
| 2003/0100286 | A1 | 5/2003 | Severson et al. |
| 2003/0215105 | A1 | 11/2003 | Sacha |
| 2004/0062392 | A1 | 4/2004 | Morton |
| 2004/0082365 | A1 | 4/2004 | Sabach et al. |
| 2004/0198237 | A1 * | 10/2004 | Abutaleb et al. ................ 455/78 |
| 2004/0218826 | A1 | 11/2004 | Terao |
| 2005/0104753 | A1 | 5/2005 | Dror et al. |
| 2005/0105552 | A1 | 5/2005 | Osterling |
| 2005/0134907 | A1 * | 6/2005 | Obuchi ............... H04N 19/423 358/1.15 |
| 2005/0169411 | A1 | 8/2005 | Kroeger |
| 2006/0159070 | A1 | 7/2006 | Deng |
| 2006/0233446 | A1 | 10/2006 | Saito et al. |
| 2007/0054621 | A1 | 3/2007 | Larsson |
| 2007/0070919 | A1 | 3/2007 | Tanaka et al. |
| 2007/0076783 | A1 | 4/2007 | Dishman et al. |
| 2007/0116046 | A1 | 5/2007 | Liu et al. |
| 2007/0149135 | A1 | 6/2007 | Larsson et al. |
| 2007/0160012 | A1 | 7/2007 | Liu |
| 2007/0171866 | A1 | 7/2007 | Merz et al. |
| 2007/0293180 | A1 | 12/2007 | Rahman et al. |
| 2008/0018502 | A1 | 1/2008 | Wegener |
| 2008/0022026 | A1 | 1/2008 | Yang et al. |
| 2008/0025298 | A1 | 1/2008 | Etai Lev-Ran |
| 2009/0092117 | A1 | 4/2009 | Jiang |
| 2009/0149221 | A1 * | 6/2009 | Liu et al. ...................... 455/561 |
| 2009/0265744 | A1 | 10/2009 | Singh et al. |
| 2009/0290632 | A1 * | 11/2009 | Wegener ...................... 375/240 |
| 2010/0067366 | A1 | 3/2010 | Nicoli |
| 2010/0177690 | A1 | 7/2010 | Okeeffe et al. |
| 2010/0202311 | A1 | 8/2010 | Lunttla et al. |
| 2010/0246642 | A1 | 9/2010 | Walton et al. |
| 2010/0285756 | A1 | 11/2010 | Nakazawa |
| 2011/0280209 | A1 | 11/2011 | Wegener |
| 2012/0008696 | A1 | 1/2012 | Wegener |
| 2012/0014421 | A1 | 1/2012 | Wegener |
| 2012/0014422 | A1 | 1/2012 | Wegener |
| 2012/0057572 | A1 | 3/2012 | Evans |
| 2012/0183023 | A1 * | 7/2012 | Filipovic et al. .............. 375/220 |
| 2012/0202507 | A1 * | 8/2012 | Zhang et al. .................. 455/450 |
| 2012/0207206 | A1 | 8/2012 | Samardzija et al. |
| 2012/0250740 | A1 | 10/2012 | Ling |
| 2012/0307842 | A1 | 12/2012 | Petrov et al. |
| 2012/0327956 | A1 | 12/2012 | Vasudevan |
| 2012/0328121 | A1 | 12/2012 | Truman et al. |
| 2014/0208069 | A1 | 7/2014 | Wegener |

FOREIGN PATENT DOCUMENTS

| | | |
|---|---|---|
| WO | 2005062494 | 7/2005 |
| WO | 2008152455 | 12/2008 |
| WO | 2009143176 | 11/2009 |
| WO | 2009/151893 | 12/2009 |
| WO | 2009151893 | 12/2009 |
| WO | 2011/135013 | 6/2011 |

OTHER PUBLICATIONS

CPRI Specification V3.0 Common Public Radio Interface (CPRI); Interface Specification, 2, Oct. 2006, 89 pages, Ericsson Ab, huawei Technologies Col Ltd, NEC Corporation, Nortel Networks SA and Siemens networks BmbH & Co. KG.

OBSAI Open Base Station Architecture Initiative Reference Point 3 Specification Ver. 4.0, Mar. 7, 2007, 119 pages.

OBSAI Open base Station Architecture Initiative BTS System Reference document Ver. 2.0, Apr. 27, 2006, 151 pages.

Maruyama, S. et al., "Base Transceiver Station for W-CDMA System," Fujitsu Sci. Tech. J. 38,2, p. 167-73, Dec. 2002.

K. I. Penderson. "Frequency domain scheduling for OFMA with limited and noisy channel feedback" 2007 IEEE 66th Vehicular Technology Conference. pp. 1792-1796, Oct. 3, 2007., see section II. C.

* cited by examiner

METHOD AND APPARATUS FOR EFFICIENT BASEBAND UNIT PROCESSING IN A COMMUNICATION SYSTEM

CROSS-REFERENCE TO RELATED APPLICATIONS

This application claims priority to U.S. Provisional Patent Application No. 61/642,322 filed on May 3, 2012 entitled, "Efficient Signal Chain Processing for Communication Systems" and to U.S. Provisional Patent Application No. 61/642,424 filed on May 3, 2012 entitled, "Method and Apparatus for Efficient Radio Processing in Communication Systems." This application is related to the patent application titled "Method and Apparatus for efficient Radio Unit Processing in a Communication System," by Mohammad Shahanshah Akhter and Brian Scott Darnell, filed on even date herewith, that is hereby incorporated by reference in its entirety.

BACKGROUND OF THE INVENTION

Transceiver systems in wireless communication networks perform the control functions for directing signals among communicating subscribers, or terminals, as well as communication with external networks. The general operations of a radio transceiver system include receiving radio frequency (RF) signals, converting them to signal data, performing various control and signal processing operations on the signal data, converting the signal data to an RF signal and transmitting the RF signal to the wireless subscriber. Transceiver systems in wireless communications networks include radio base stations and distributed antenna systems (DAS). For the reverse link, or uplink, a terminal transmits the RF signal received by the transceiver system. For the forward link, or downlink, the transceiver system transmits the RF signal to a subscriber, or terminal, in the wireless network. A terminal may be fixed or mobile wireless user equipment unit (UE) and may be a wireless device, cellular phone, personal digital assistant (PDA), personal computer or other device equipped with a wireless modem.

The rapid increase in data (e.g., video) communication and content consumption has led to expansion of wireless communication networks. As a result, the introduction of next generation communication standards (e.g., 3GPP LTE-A, IEEE 802.16m) has led to improved techniques for data processing, such as carrier aggregation (e.g., 100 MHz) with 8×8 MIMO (Multiple-Input, Multiple-Output) and CoMP (Cooperative Multi-Point). This in turn has created the need for radio access networks capable of handling wider bandwidths and an increasing number of antennas. These radio access networks will require a higher numbers of fiber links to connect the base stations to the remote radio units. In addition, it is desirable to provide carrier aggregation with Multiple-Input and Multiple-Output (MIMO) and Co-operative Multipoint (CoMP) techniques to significantly increase spectral efficiency. The implementation of Co-Operative Multi-point techniques requires communication between baseband units and enables load balancing for the communication system.

Modern communication systems require an increasing number of optical or copper ports and links between the baseband units and the radio units to support the various protocols and they often require a large number of discrete devices and signal routing traces to support the improved architectures. However, the improved architectures may not scale due to input and output bottlenecks. The large number of discrete devices and signal routing may also increase the cost of the device. Additionally, innovative device architectures will be required to support the increased clock frequency operation and the larger number of processing functions to efficiently process uplink, feedback and downlink data in addition to the required control signals. To support remote monitoring, debugging, control and management, such devices will also need to support a large amount of data storage.

Accordingly, there is a need for a method and apparatus that will allow for an increasing number of antennas at the radio unit as well as implementation of MIMO, CoMP and load balancing, while reducing power consumption and cost of the device. Also, there is a need for a method and apparatus that will provide these features while reducing the number of discrete devices.

SUMMARY OF THE INVENTION

The present invention provides a method and apparatus that will allow for an increasing number of antennas at the radio unit as well as implementation of MIMO, CoMP and load balancing, while reducing power consumption and cost of the baseband unit of the communication network. The present invention additionally provides a method and apparatus that will provide these features while reducing the number of discrete devices in the baseband unit.

The method and apparatus of the present invention provides for reduced power consumption and cost while supporting wide bandwidth signals from a large number of antennas, as is required by next generation systems.

A method and apparatus are disclosed in which compressed signals from remote radio units are sent directly to the switch instead of to a separate CPRI device. Thereby, the local input and output bottleneck within processing devices is removed in the data path of the signals between the remote radio units and the baseband unit. This also reduces the number of ports in the switch and bandwidth requirement for the switch. By eliminating a separate CPRI device and transmitting signals directly to the switch, it is possible to perform simpler load balancing and easier traffic migration directly from the switch instead of going through another device which could create local I/O bottleneck. This further allows easier scalability, more efficient baseband resource allocation and utilization depending on the network load.

In a particular embodiment for a communication system operating in an uplink mode, a method for processing data in a baseband unit of a communication system may include, receiving compressed data at a switch of a baseband unit, wherein the compressed data is received from at least one radio unit and operating the switch to distribute the compressed data to one of a plurality of baseband processing cards of the baseband unit. The method may further include, decompressing the compressed data at one of the plurality of baseband processing cards. In an alternative embodiment, the method may include operating the switch to decompress the compressed data and to distribute the decompressed data to one of the plurality of baseband processing cards.

In an additional embodiment for a communication system operating in a downlink mode, a method for processing data in a baseband unit of a communication system may include, receiving data at one of a plurality of baseband processing cards of a baseband unit, wherein the data is received from a communication backhaul, compressing the data at the one of the plurality of baseband processing cards and transmitting the compressed data to a switch of the baseband unit. In an alternative embodiment, the method may include transmitting the data to a switch of the baseband unit without compressing the received data and compressing the data at the switch of the baseband unit and decompressing the data at the switch.

The switch may be located on one of the plurality of baseband cards of the baseband unit or alternatively, the switch may be located on one of a plurality of switch cards of the baseband unit.

The compressed data may be received at the switch of the baseband unit from a wired connection or a wireless connection from at least one radio unit.

The switch may perform protocol conversion of the compressed data at the baseband unit. Additionally, the switch may perform load-balancing of the compressed data through the switch of the baseband unit.

In an additional embodiment, an apparatus for processing data in a baseband unit of a communication system may include at least one computation processor of a baseband unit and a switch coupled to the at least one computation processor. The switch may be configured to receive compressed data from at least one radio unit and to distribute the compressed data to one of the at least one computation processors. In an alternative embodiment, the switch may be configured to decompress the compressed data prior to distributing the decompressed data to one of the at least one computation processors.

In another embodiment, an apparatus for processing data in a baseband unit of a communication system may include a switch of a baseband unit and at least one computation processor coupled to the switch. The computation processor may be configured to receive data from a backhaul connection and to compress the data prior to transmitting the data to the switch. In an alternative embodiment, the computation processor may be configured to transmit the data to the switch without compressing the data. The switch may then be configured to compress the data prior to transferring the data to the radio units.

DETAILED DESCRIPTION

The modular design approach for radio transceiver systems, wherein the baseband processing is separated from the radio frequency processing, has led the industry to develop interface standards. One example of a standard interface for the data transfer interfaces between the radio units and baseband units of transceiver systems is the Common Public Radio Interface (CPRI). Connection topologies between the baseband unit and one or more remote radio units include point-to-point, multiple point-to-point, chain, star, tree, ring and combinations thereof. Another example of an interface specification for modular architecture of radio transceiver systems is the Open Base Station Architecture Initiative (OBSAI). The OBSAI specification describes alternative protocols for the interconnection of and baseband modules and remote radio units analogous to the CPRI specification, as well as data transfer protocols for the serial data links.

In conventional cellular communication systems, radio coverage is provided for a given geographic area via multiple base stations distributed throughout the geographic area involved. In this way, each base station can serve traffic in a smaller geographic area. Consequently, multiple base stations in a wireless communication network can simultaneously serve users in different geographic areas, which increases the overall capacity of the wireless network involved.

In order to further increase the capacity of wireless systems further, each base station may be configured to support radio coverage in multiple sectors. For example, a base station in a conventional cellular system may be configured to provide radio coverage in one sector, three sectors or six sectors. In those systems employing multiple sectors per base station, each sector can handle part of the traffic in an additional smaller geographic area, which increases the overall capacity of the wireless network involved. Each of the sectors may include multiple remote radio units in communication with each of the base stations. Each of the radio units may further include multiple antennas for both receiving and transmitting data between the radio unit and the user of the communication system.

As described, communication systems are known in the art to include a baseband unit for performing signal processing in communication with a remote radio unit for receiving and transmitting signals to an antenna. The present invention provides a method and apparatus for an efficient processing solution implemented in the baseband unit of a communication system.

Figure 1A:
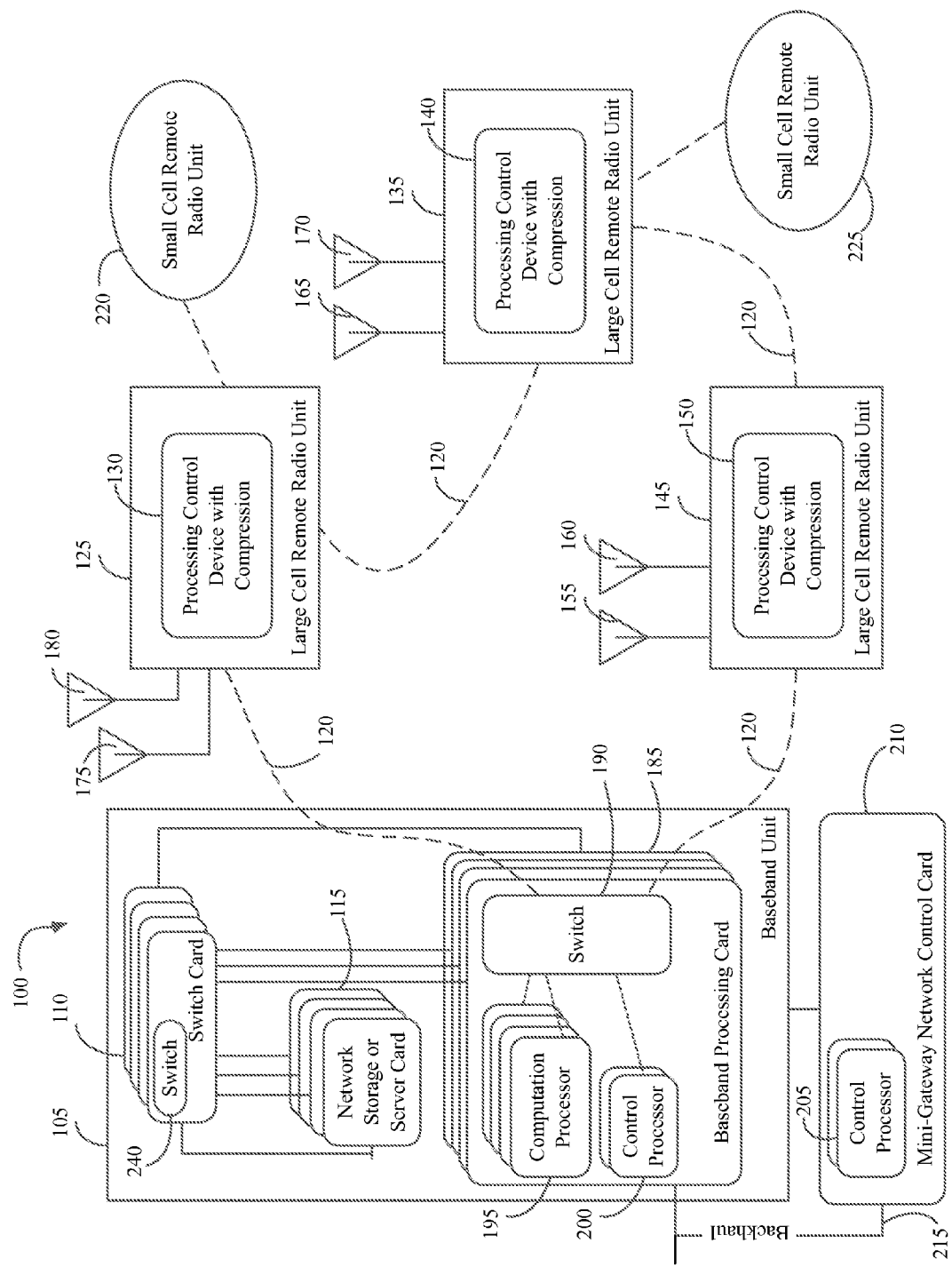
FIG. 1A is block diagram illustrating a communication system in accordance with an embodiment of the present invention employing a single radio access technology (RAT) configured in a chain topology.
Figure 1B:
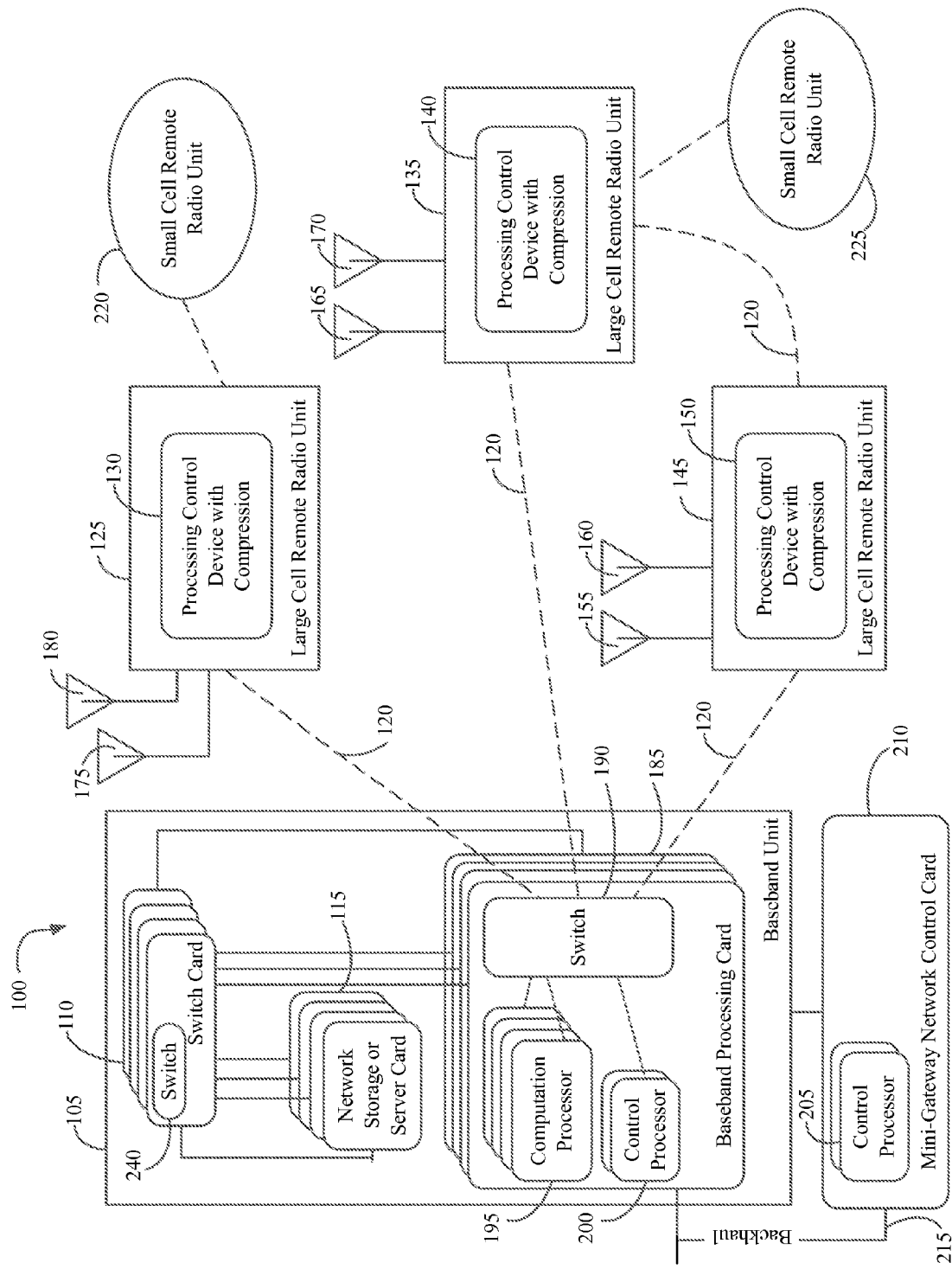
FIG. 1B is block diagram illustrating a communication system in accordance with an embodiment of the present invention employing a single radio access technology (RAT) configured in a star topology.

With reference to FIG. 1A and FIG. 1B, in a communication system 100, remote radio units 125, 135, 145 may include one or more antenna 155, 160, 165, 170, 175, 180 that may be used to transmit radio frequency data to a user or to receive radio frequency data from a user. The remote radio units 125, 135, 145 may be coupled to a baseband unit 105 and to each other through either a wired or wireless connection 120. In a particular embodiment, the connection may be a wired CPRI link. The baseband unit 105 may include a plurality of baseband processing cards 185. Each of the baseband processing cards 185 may further include at least one computation processor 195 and at least one control processor 200. The computation processor 195 may be a digital signal processor (DSP), an application-specific integrated circuit (ASIC) or a field-programmable gate array (FPGA). The computation processor 195 of the present invention may include circuitry for processing a digital signal received from one of the remote radio units 125, 135, 145 or from a backhaul connection 215 via a mini-gateway or network card 210. The control processor 200 of the baseband processing card 185 may include circuitry for controlling the flow of data through the baseband processing card 185. The mini-gateway/network card 210 may further include a control processor 205 for controlling the flow of data through the mini-gateway/network card 210. The mini-gateway/network card 210 may serve as an interface from the remote radio unit directly to the network. In a particular embodiment, the computation processor 195 may further include circuitry for compressing or decompressing data received from one of the remote radio units 125, 135, 145 or from a backhaul connection 215. The baseband processing card 185 may further include a switch 190 coupled to the computation processor 195 and to the control processor 205. The switch 190 may include circuitry for distributing data received from one or more of the remote radio units 125, 135, 145 to one or more computation processors 195. The switch 190 may further include circuitry for distributing data received from the computation processor 195 to one or more of the remote radio units 125, 135, 145. The switch 190 may further include circuitry to accommodate a plurality of protocols, including, but not limited to CPRI, OBSAI, S-RIO and Ethernet. The baseband unit 105 may further include one or more network storage or server cards 115 coupled to the baseband processing cards 185. The network storage or server cards 115 may be used storing data and making data available to the communication network. The baseband unit may further include one or more switch cards 110 coupled to the baseband processing cards 185. Each of the switch cards 110 may include one or more switches 240 for distributing data received from one or more of the remote radio units 125, 135, 145 to the computation processor 195 through the switch at 190. The switch cards 110 may further include one or more switches 240 for distributing data received from the computation processor 195 to one or more of the remote radio units 125, 135, 145 through the switch at 190. The network storage or server cards 115 may be directly coupled to a switch 240 of the switch cards 110, allowing the system to perform predictive caching and to run applications locally on the baseband processing unit 105. Having the network storage or server cards 115 directly coupled to a switch 240 of the switch cards 110 may reduce the backhaul 215 bandwidth from the baseband unit 105 to the gateway 210.

In the embodiments illustrated in FIGS. 1A and 1B, data from the remote radio units 125, 135, 145 is transmitted directly to the switch 190 when the communication system is operating in an uplink mode. In this embodiment, the switch 190 is located on one of the plurality of baseband processing cards 185. Each of the remote radio units 125, 135, 145 may include a processing control device 130 for processing the radio frequency data received from the user and for compressing the data prior to transmitting the data to the baseband unit 105 over the CPRI link 120 either directly or bridging through another remote radio unit. FIGS. 1A and 1B illustrate an embodiment wherein the communication system employs a single radio access technology (RAT). In this embodiment, a common radio access technology (RAT) is used for both the remote radio units 125, 135, 145 operating in a large cell and additional radio units operating in a number of small cells 220, 225. The radio unit operating in small cells 220, 225 may be coupled to the remote radio units operating in large cells 125, 135, 145 over a wired or wireless link. As such, the data from the small cells 220, 225 may be communicated to the remote radio units 125, 135, 145 prior to being transmitted to the baseband unit 105. The remote radio units 125, 135, 145 may be coupled to each other in a daisy-chain configuration or other configurations commonly known in the art for different cell sizes (e.g., small cell, large cell etc.). The embodiment shown with reference to FIG. 1A illustrates a communication network wherein the connection between the baseband unit and the one or more remote radio units is implemented in a chain or ring topology. In an additional embodiment, illustrated with reference to FIG. 1B, the connection topology of the baseband unit and the one or more remote radio units may include point-to-point, multiple point-to-point, star, tree, or combinations thereof.

When operating in an uplink mode, the data from the remote radio units 125, 135, 145 and the data from the small cell remote radio units 220, 225 is compressed prior to being transmitted directly to the switch 190 of the baseband unit. The switch 190 may then be operated to distribute the compressed data to one of the baseband processing cards 185. The computation processors 195 of the baseband processing card may then be used to further process the received data and to decompress the data prior to distribution over the backhaul 215. As such, in the present invention, the compressed data from the remote radio units is sent directly to the switch 190 without first being decompressed by an intermediate device such as a CPRI device or other digital signal processing device. In this way, the port count of the switch 190 can be reduced because the switch 190 is responsible for distributing compressed data instead of decompressed data. Additionally, the switch 190 can run at a lower speed when distributing the compressed data as compared to the decompressed data, thereby reducing the power consumption of the baseband unit.

In an alternative embodiment, the data received from the remote radio units may be decompressed at the switch 190 prior to being distributed to the computation processor 195. In this embodiment, the power consumption of the switch 190 may not be reduced, but the on-chip switch core bandwidth may still be reduced.

The switch 190 may also be operated to distribute the compressed data to the network storage or server card 115 through switch 240. By distributing compressed data, instead of decompressed data, to the network storage or server card 115, the storage capacity of the network storage or server card 115 may be increased.

In the embodiment illustrated in FIG. 1A and FIG. 1B, when the communication system is operating in a downlink mode, the data to be transmitted to the remote radio units 125, 135, 145 may be compressed at the computation processor 195 of the baseband unit 105 prior to being transmitted to the switch 190. In this way, the switch 190 may be operated at a lower per port speed when transmitting the compressed data to the remote radio units 125, 135, 145 over the CPRI link, thereby reducing the power consumption of the device. In an alternate embodiment, the switch 190 may perform the data compression instead of the computation processor 195. When compression is performed in the switch 190, the power consumption of the device may not be reduced but the on-chip switch core bandwidth may still be reduced.

Figure 2A:
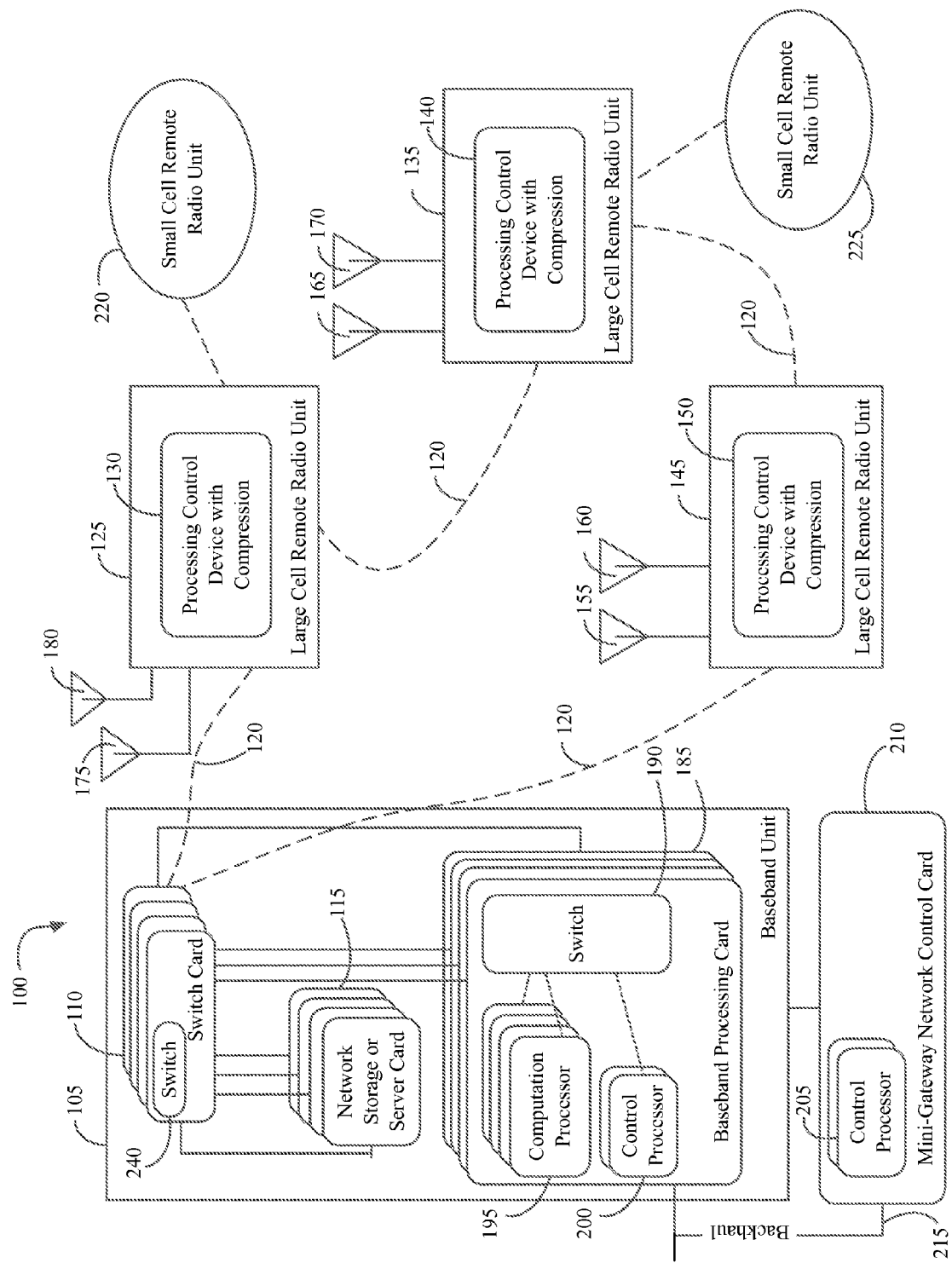
FIG. 2A is a block diagram illustrating a communication system in accordance with an embodiment of the present invention employing a single radio access technology (RAT) for large and small cells configured in a chain topology.
Figure 2B:
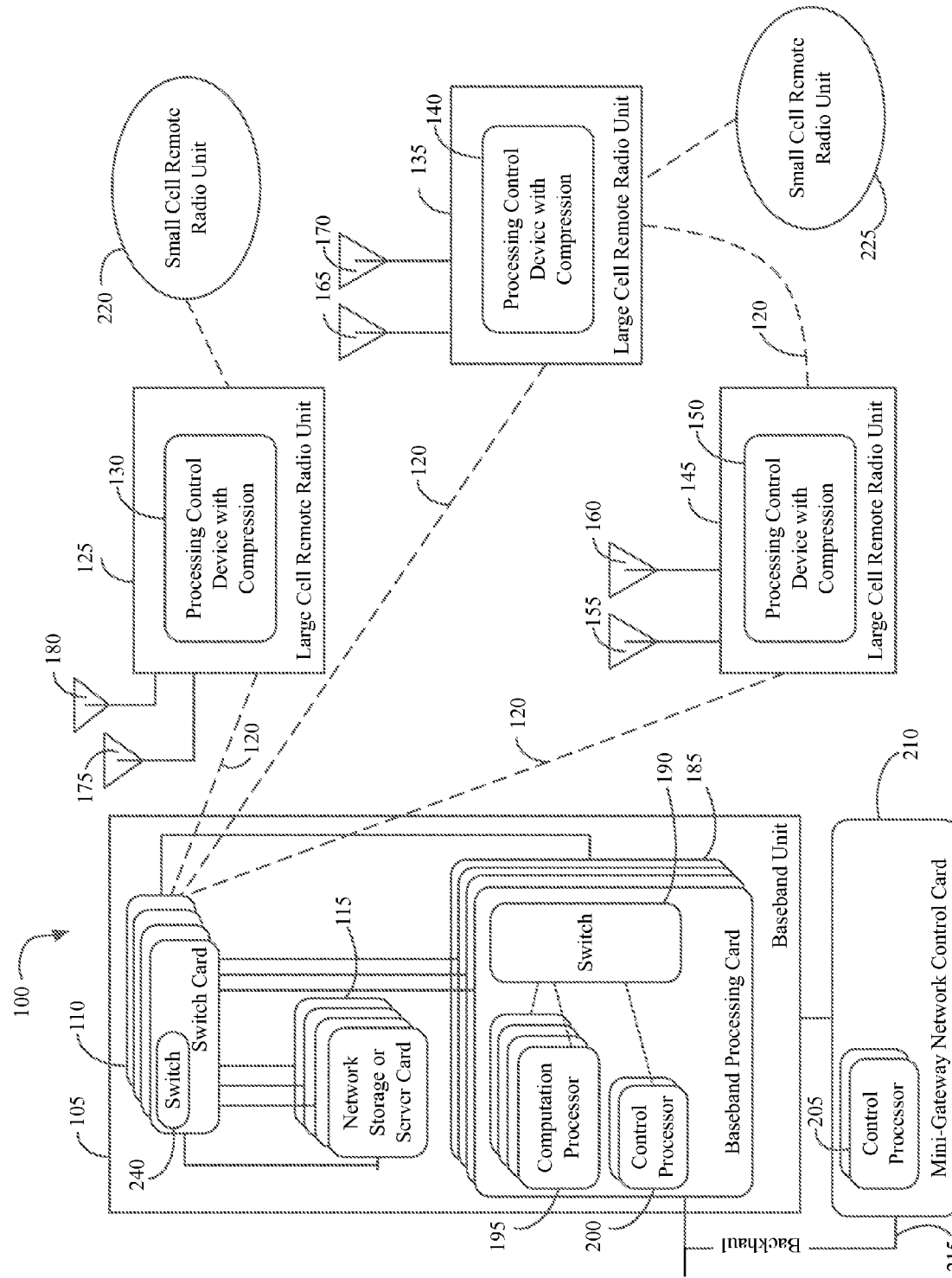
FIG. 2B is a block diagram illustrating a communication system in accordance with an embodiment of the present invention employing a single radio access technology (RAT) for large and small cells configured in a start topology.
Figure 3:
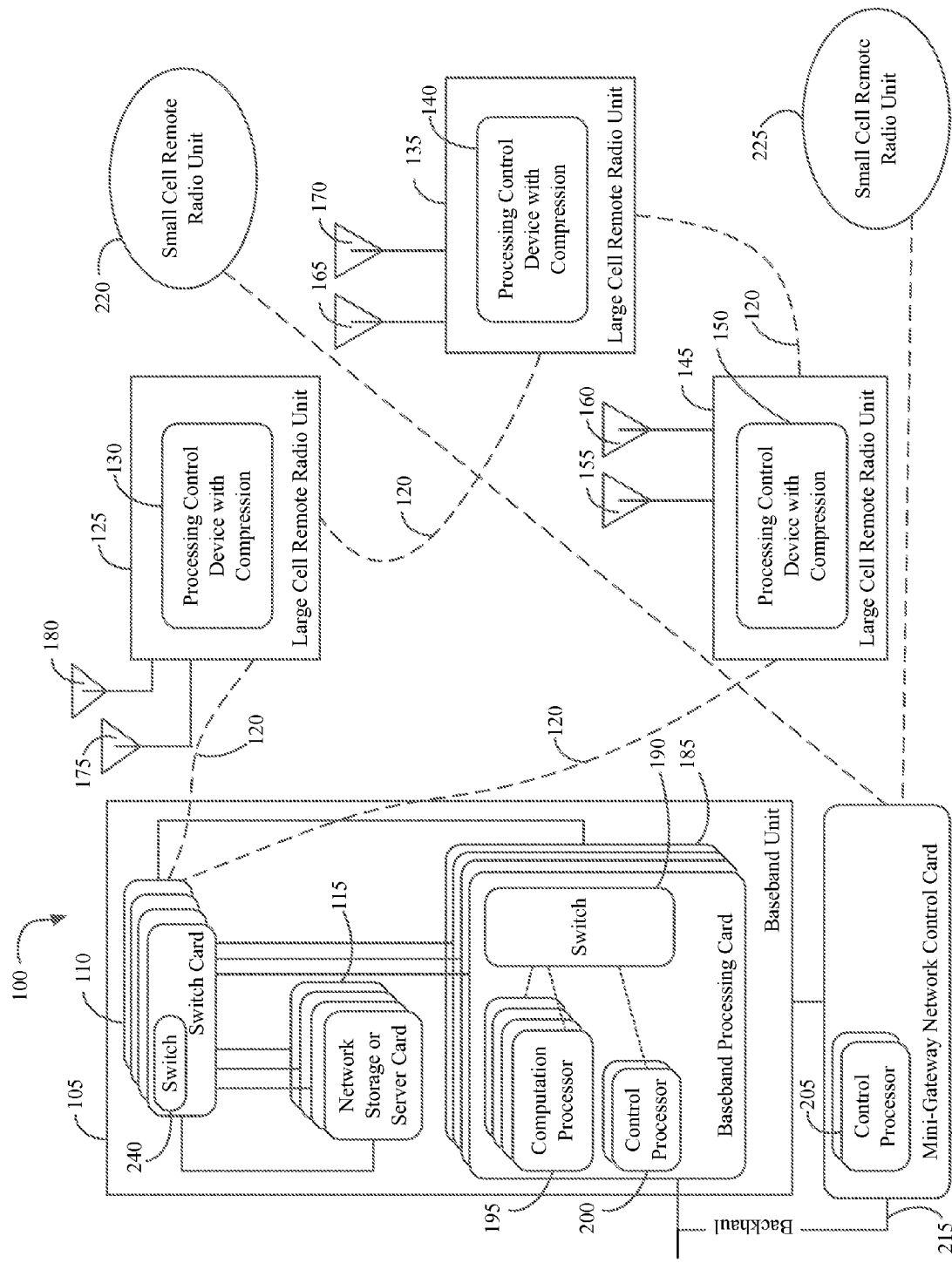
FIG. 3 is a block diagram illustrating a communication system in accordance with an embodiment of the present invention employing a heterogeneous radio access technology (HetNet) with two different radio access technologies.

In an additional embodiment of the present invention, illustrated with reference to FIG. 2A and FIG. 2B, the data from the remote radio units 125, 135, 145 and the data from the small cell remote radio units 220, 225 may be coupled to a switch 240 of the switch card 110 instead of the switch 190 of the baseband processing cards 185. The switch 240 may be a multi-layer or single-layer switch and may connect all of the baseband cards 185 in the pool. Both the switch 240 located at the switch card 110 and the switch 190 on the individual baseband processing card 185 are capable of supporting wide bandwidth signals employing a large number of antennas by optimizing resource usage through sharing of the baseband processing resources across multiple baseband processing cards 185. The switch 240 and the switch 190 may be configured to distribute data traffic efficiently based upon demand since the data traffic is directly distributed from the switch instead of being processed through an intermediate device, such as a digital signal processor, FPGA or ASIC. This configuration allows load-balancing of data traffic from different cells to optimize the capacity of the pool of baseband processing cards 185. The configuration of the present invention also allow capacity enhancement through CoMP techniques. The embodiment shown with reference to FIG. 2A illustrates a communication network wherein the connection between the baseband unit and the one or more remote radio units is implemented in a chain or ring topology. In an additional embodiment, illustrated with reference to FIG. 2B, the connection topology of the baseband unit and the one or more remote radio units may include point-to-point, multiple point-to-point, star, tree, or combinations thereof. With reference to FIG. 3, the system and method of the present invention may be implemented in a heterogeneous network (HetNet). Next generation networks may be heterogeneous wherein different radio access technologies, such as WLAN, UMTS, WiMax and satellite networks may be utilized simultaneously in order to provide the mobile users with an improved quality of service. As shown in FIG. 3, a large cell may employ a first radio access technology implemented in the remote radio units 125, 135, 145 and a small cell may employ a second radio access technology implemented in the small cell remote radio units 220, 225. The remote radio units 125, 135, 145 of the large cell may be coupled to the switch 240 of the switch card 110 to allow the exchange of data between the remote radio units 125, 135, 145 and the baseband unit 105. The small cell radio units 220, 225 may be coupled to the mini-gateway network control card 210. The connection between the small cell radio units 220, 225 and the mini-gateway network control card 210 may be wired or wireless. In this embodiment the mini-gateway network card 210 is connected to the switch 240 of the switch card 110 for easier load-balancing across the heterogeneous network. Since the gateway 210 is directly connected to the switch 240, it is possible to manage easier load-balancing for network demand arising from different cellular regions. In this embodiment the signal data transmitted between the mini-gateway network card 210 and the antenna nodes of the small cell 220, 225 may not be compressed. Accordingly, the signal data processed through mini-gateway network card 210 may be uncompressed, allowing for contemporaneous processing of both compressed and decompressed signal data.

In accordance with the embodiment illustrated with reference to FIG. 3, when operating in an uplink mode, the data from the remote radio units 125, 135, 145 is compressed prior to being transmitted directly to the switch 240 of the baseband unit. The switch 240 may then be operated to distribute the compressed data to one of the baseband processing cards 185 or to the network storage or server card 115. The computation processors 195 of the baseband processing card may then be used to further decompress and process the compressed data received from the switch. As such, in the present invention, the compressed data from the remote radio units is sent directly to the switch 240 without first being decompressed by an intermediate device such as a CPRI device or other digital signal processing device. Alternatively, the switch 240 may be used to decompress the data prior to distribution to the baseband processing card 185. In addition, the mini-gateway network control card 210 may receive data from the small cells 220, 225 that is not compressed.

In a downlink mode, the system illustrated with reference to FIG. 3 may first compress the data at the computation processor 195 of the baseband processing card 185 prior to transmitting the compressed data to the switch 240 of the switch card 110. As such, in the present invention, the switch 240 may distribute compressed data from the baseband processing cards 185 to the radio units 125, 135, 145 of the large cell and the radio units of the small cells 220, 225. Alternatively, the switch 240 may be used to compress the data prior to distribution to the radio units.

Figure 4:
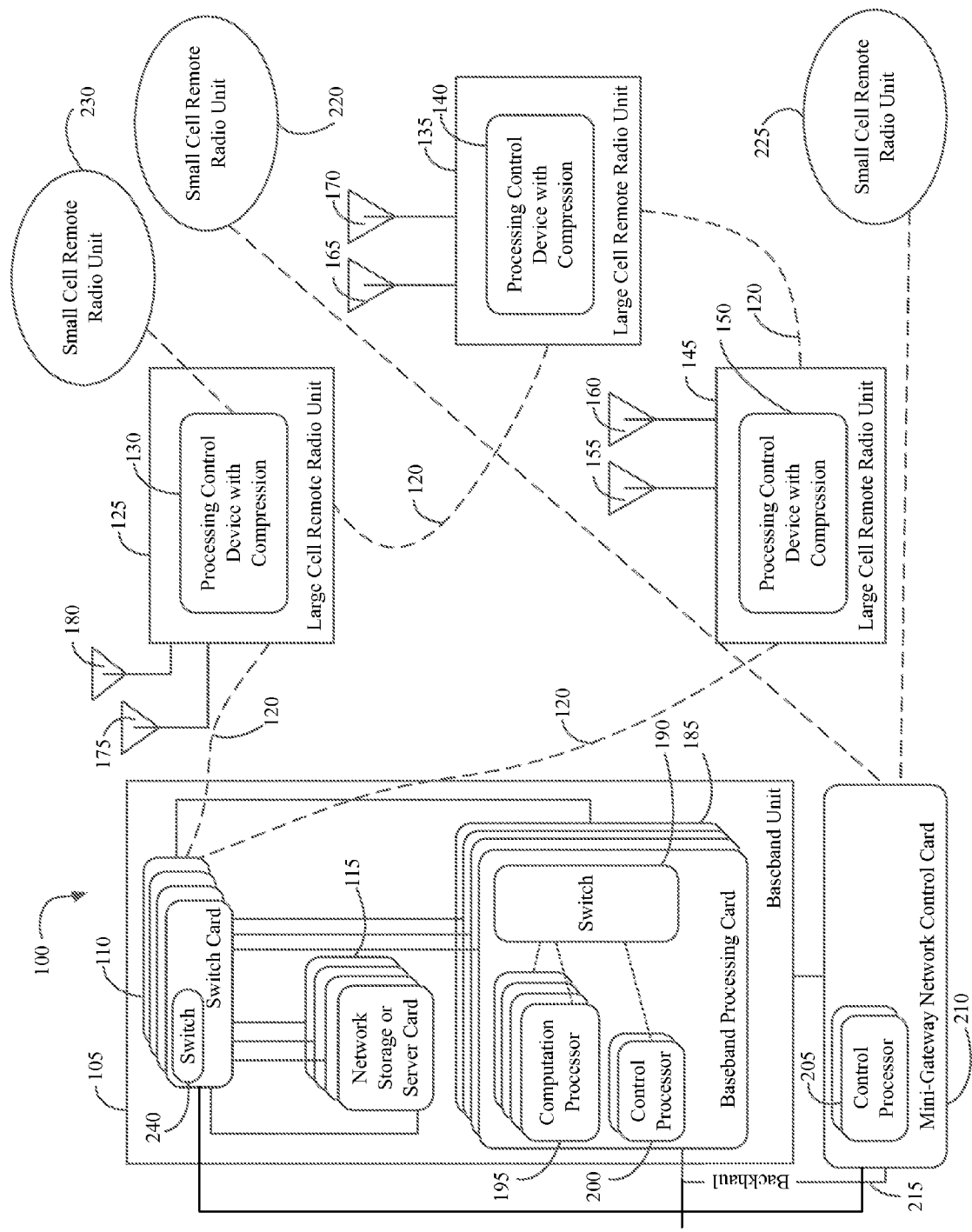
FIG. 4 is a block diagram illustrating a communication system in accordance with an embodiment of the present invention employing a heterogeneous radio access technology (HetNet) with two different radio access technologies.

With reference to FIG. 4, the system and method of the present invention may be implemented in a heterogeneous network (HetNet), wherein a first radio access technology supports both a large cell (i.e. Macro) and a small cell (LTE-A small cell). As shown in FIG. 4, a first radio access technology may be employed in both a large cell including remote radio units 125, 135, 145 and a small cell including small cell remote radio units 230. The remote radio units 125, 135, 145 of the large cell may be coupled to the switch 240 of switch card 110 and small cell remote radio unit 230 may be coupled to the switch 240 to allow the exchange of data between the remote radio units 125, 135, 145 and the baseband unit 105. The small cell radio units 220, 225 may be coupled to the mini-gateway network control card 210. The connection between the small cell radio units 220, 225 and the mini-gateway network control card 210 may be wired or wireless. In this embodiment the mini-gateway network card 210 is connected to the switch 240 for easier load-balancing across the heterogeneous network. Since the gateway 210 is directly connected to the switch 240, it is possible to perform easier load-balancing for network demand arising from different cellular regions. In this embodiment the signal data transmitted between the mini-gateway network card 210 and the antenna nodes of the small cell 220 may not be compressed. Accordingly, the signal data processed through mini-gateway network card 210 may be uncompressed, allowing for contemporaneous processing of both and decompressed signal data.

In accordance with the embodiment illustrated with reference to FIG. 4, when operating in an uplink mode, the data from the remote radio units 125, 135, 145 of the large cell and remote radio unit 330 of the small cell is compressed prior to being transmitted directly to the switch 240 of the switch card 110 of the baseband unit. The switch 240 may then be operated to distribute the compressed data to one of the baseband processing cards 185 or to the network storage or server card 115. The computation processor 195 of the baseband processing card may then be used to further decompress and process the compressed data received from the switch. As such, in the present invention, the compressed data from the remote radio units is sent directly to the switch 240 without first being decompressed by an intermediate device such as a CPRI device or other digital signal processing device. Alternatively, the switch 240 may be used to decompress the data prior to distribution to the baseband processing card 185. In addition, the mini-gateway network control card 210 may receive data from the small cells 220, 225 that is not compressed.

In a downlink mode, the system illustrated with reference to FIG. 4 may first compress the data at the computation processor 195 of the baseband processing card 185 prior to transmitting the compressed data to the switch 240 of the switch card 110 through the switch 190. As such, in the present invention, the switch 240 may distribute compressed data from the baseband processing cards 185 to the radio units 125, 135, 145 of the large cell and the radio units of the small cells 230. Alternatively, the switch 240 may be used to compress the data prior to distribution to the radio units.

Figure 5:
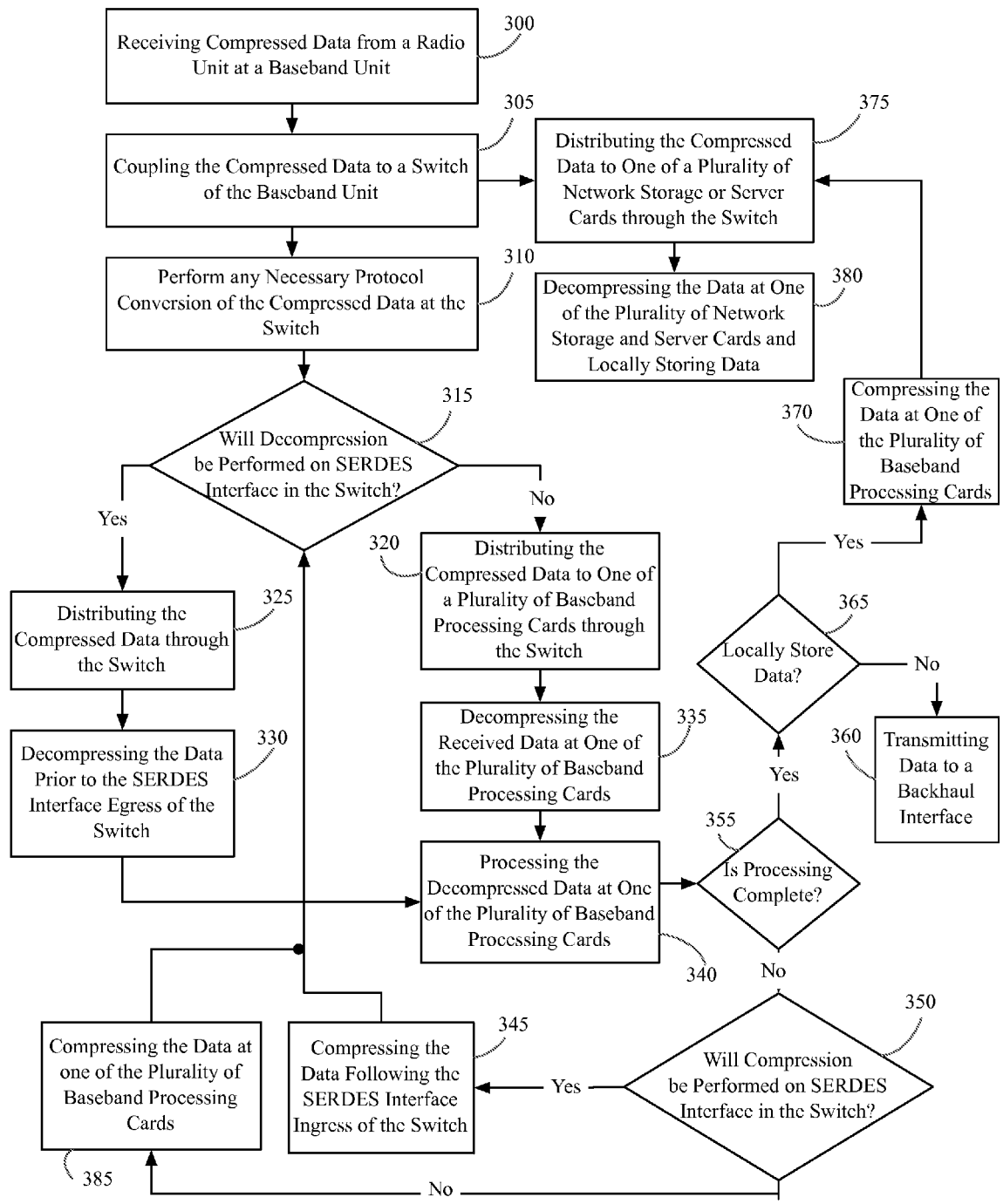
FIG. 5 is a flow diagram illustrating a method of the present invention operating in an uplink mode.

With reference to FIG. 5, in an uplink mode of an embodiment of the present invention, compressed data may be received from a radio unit at a baseband unit 300. The compressed data may then be coupled to a switch of a baseband unit 305. The switch may then perform any necessary protocol conversion of the compressed data within the switch 310. It may then be determined if decompression of the compressed data will be performed in the switch or in the SoC/ASIC/FPGA/DSP of the one of a plurality of baseband processing cards. This determination may be dependent upon the design of the baseband unit. In some embodiments, the SoC/ASIC/FPGA/DSP of the baseband processing card may be capable of performing the decompression and the decompression may be performed at the baseband processing card. In another embodiment, the baseband processing card may be incapable of performing decompression and as such, the switch may be used to decompress the data.

If it is determined that the switch will not perform the decompression, the compressed data may be distributed to one of a plurality of baseband processing cards 320 through the switch. The compressed data may then be decompressed at the baseband processing card 335 and then further processed by the computation processor of the baseband processing card 340. Alternatively, if it is determined that the switch will perform the decompression, the compressed data may be distributed through the switch 325 and then the compressed data may be decompressed prior to exiting the switch 330. The decompressed data may then be transmitted from the switch to one of the baseband processing cards for further processing 340.

After the data has been either decompressed by the switch 330 or by one of the baseband processing cards 335, it may then be determined whether or not the processing of the data is complete 355. If the processing of the data is complete, the decision is made as to whether or not to locally store the data 365. If the data is to be stored, the data may be compressed at one of the plurality of baseband processing cards 370 and distributed to one of a plurality of network storage or server cards through the switch 375. The distributed data may then be decompressed at one of the plurality of network storage or server cards and stored locally 380 for subsequent access. In addition to locally storing the data, the data may also be transmitted to a backhaul interface 360. If the processing of the data is not complete 355, it may then be determined whether or not the switch will perform the compression of the data 350 prior to further processing of the data. If the switch is to perform the compression, the data will be compressed at the ingress to the switch 345, prior to distributing the data to one of the plurality of baseband processing cards through the switch 320. Alternatively, if it is determined that the switch will not perform the compression, the data may be compressed by of the plurality of baseband processing cards 385 prior to distributing the data through the switch 320.

Figure 7:
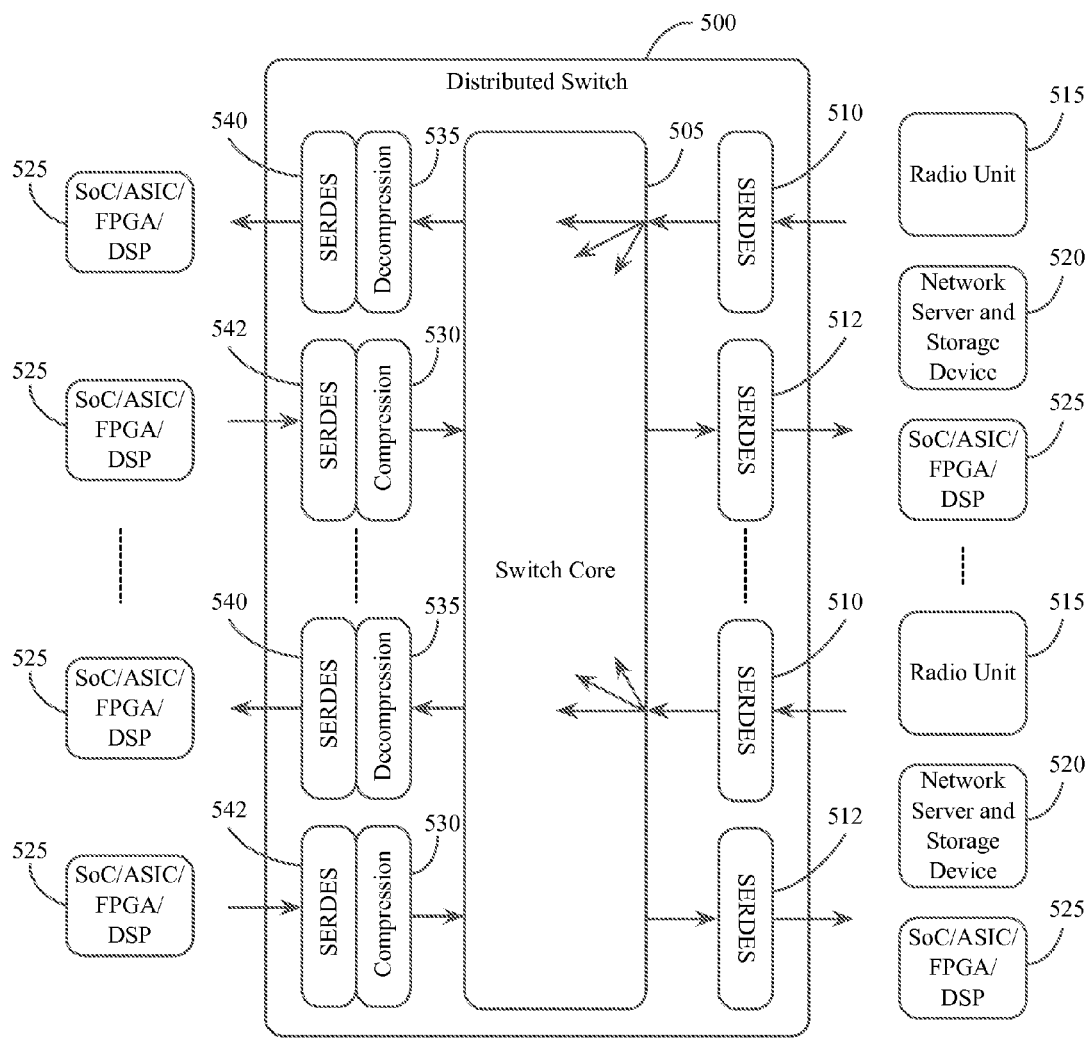
FIG. 7 is a block diagram illustrating a distributed switch in accordance with an embodiment of the present invention.

With reference to FIG. 7, in an uplink mode of an embodiment of the present invention, compressed data from a radio unit 515 may be received at a SERDES ingress interface 510 of distributed switch 500. A SERDES interface is commonly used as a high-speed serial/deserializer interface. The compressed data may then be distributed through the switch core 505 and decompressed 535 prior to exiting the switch at SERDES egress interface 540. Alternatively, the compressed data from the radio unit 515 may be received at the SERDES ingress interface 510 of the distributed switch 500, distributed to one of the plurality of baseband processing cards 525 and decompressed at one of the plurality of baseband processing cards 525. After the processing of the data is complete, the data may be compressed and transmitted to one or more network server or storage devices 520.

Figure 6:
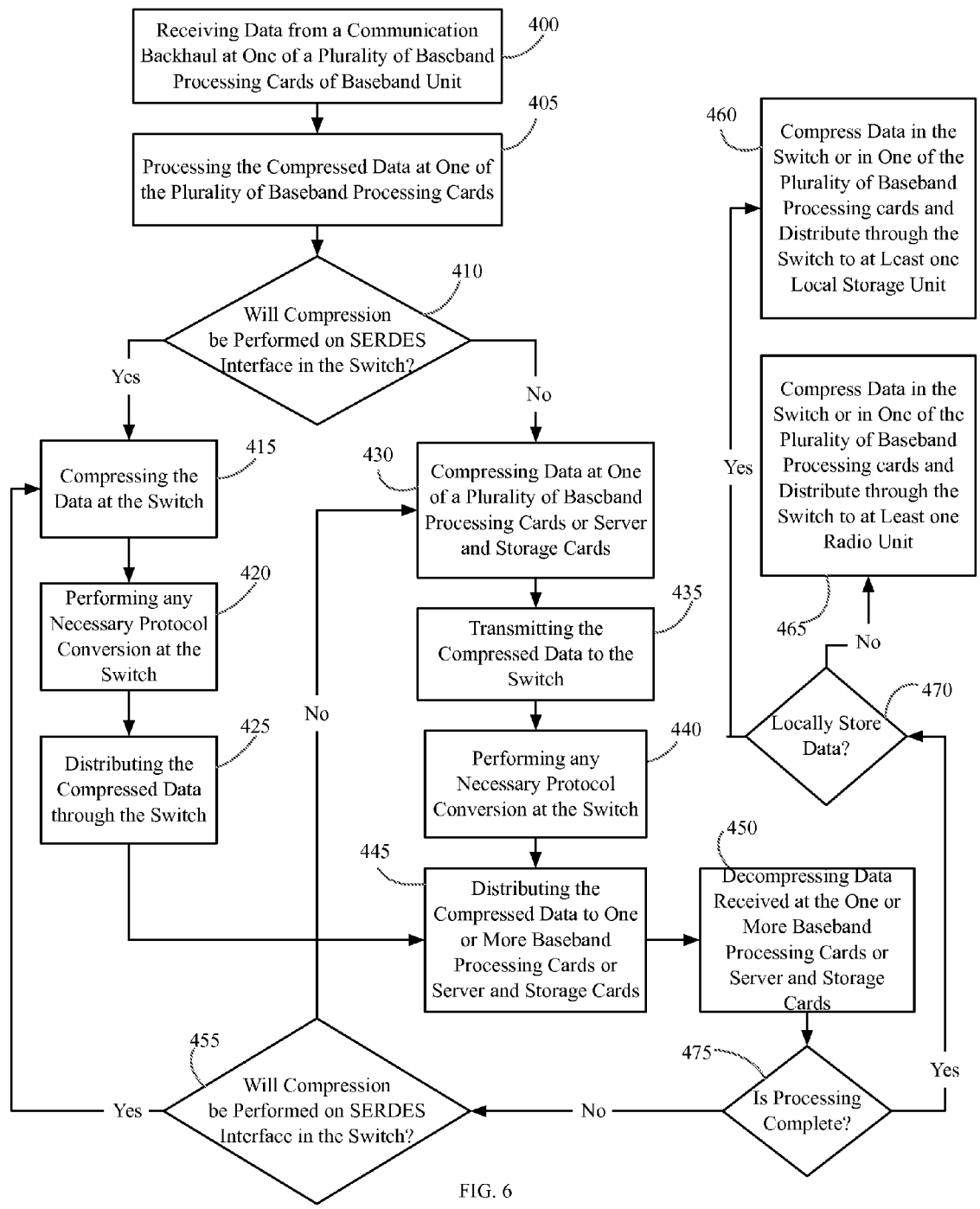
FIG. 6 is a flow diagram illustrating a method of the present invention operating in a downlink mode.

With reference to FIG. 6, in a downlink mode of an embodiment of the present invention, data from a communication backhaul, a network server or a storage card may be received at one of a plurality of baseband processing cards of a baseband unit 400. The baseband processing card may further process the received data 405. After the baseband processing card has processed the data 405, it may then be determined if compression of the data will be performed in the switch or in the SoC/ASIC/FPGA/DSP of the one of a plurality of baseband processing cards. This determination may be dependent upon the design of the baseband unit. In some embodiments, the SoC/ASIC/FPGA/DSP of the baseband processing card may be capable of performing the compression and the compression may be performed at the baseband processing card. In another embodiment, the baseband processing card may be incapable of performing compression and as such, the switch may be used to compress the data.

If it is determined that the switch will not perform the data compression, the data may be compressed at one of the plurality of baseband processing cards 430 prior to transmitting the compressed data to the switch 435. Protocol conversion may then be performed in the switch 440 if necessary. After any necessary protocol conversion has been performed 440, the compressed data may be distributed to one or more baseband processing units, or server or storage units for further processing 445. Alternatively, if it is determined that the switch will perform the data compression, the switch may compress the data 415 and perform any necessary protocol conversion 420 of the data. The switch may then distribute the data to one or more baseband processing units for further processing 445.

Upon receiving the compressed data from either the switch or one of the baseband processing units, the baseband processing unit may decompress the data and perform additional processing on the data 450. If it is then determined that the processing of the data is not complete 475, the determination of whether or not to compress the data in the switch 455 prior to further processing can be made. If it is determined that the switch will perform the compression, the data requiring additional processing may be transmitted to the switch for subsequent compression 415 and distribution 425. Alternatively, if it is determined that the switch will not perform the compression, the data requiring additional processing may be transmitted to one of the plurality of baseband processing cards for subsequent compression 430 and distribution 445. Alternatively, if it is determined that the processing is complete 475, a decision may be made regarding the storage of the data 470. If the data is to be stored locally, the data may be compressed at the switch or at one or more of the baseband processing units and stored locally for subsequent retrieval 460. In addition to storing the data, the data may also be compressed at the switch or at one or more of the baseband processing units and distributed through the switch to at least one radio unit over a wired or wireless interface 465.

With reference again to FIG. 7, in a downlink mode of an embodiment of the present invention, data from a communication backhaul, network server or storage card 520 may be received at a baseband processing card 525. After the data has been processing at the baseband processing card 525, the data may be transmitted to SERDES ingress interface 542 of distributed switch 500. A SERDES interface is commonly used as a high-speed serial/deserializer interface. The switch may perform compression 530 of the data received at the SERDES ingress 542 prior to distributing the compressed data through the switch core 505. Alternatively, the data may be compressed at the baseband processing card 525 prior to transmitting the compressed data to the SERDES ingress 510 of the switch core 505.

In the proposed architecture in the uplink, the signal from the radio is directly sent to the switch instead of separate CPRI device or SOC/ASIC/FPGA/DSP. This method eliminates any local I/O bottleneck within processing device that is in the data path. The proposed system and method also allows easier scalability, more efficient resource utilization as well as simpler load balancing through traffic migration.

Decompression of the signal could also be performed at the switch. In embodiments in which decompression of the signal is performed at the switch, the switch is an integrated circuit device formed on a single semiconductor die that includes a decompression module that is operable to selectively decompress incoming signal data as required by its routing instructions and programming of the switch.

Decompression of the signal could also be performed at the baseband processing devices or at the remote radio units.

The architecture supports either of the protocols (S-RIO/CPRI/Ethernet) over wired or wireless medium. The proposed solution includes compression/decompression at the baseband card either in the SOC/ASIC/FPGA/DSP or in the switches. When included in SOC/ASIC/FPGA/DSP, the switch bandwidth, port count, SERDES count, number of routing on the board could be reduced. When included in the switch, the switch core throughput could be reduced. Either way, power consumption, cost, and routing are reduced at the baseband side.

The system and method of the present invention supports better system and device level approaches for load balancing and CoMP for wide bandwidth signals having a large number of antennas. The proposed approach significantly reduces infrastructure cost (baseband units and radio units) by reducing fiber links as well as by optimizing resources. The methods and apparatus of the present invention allows interconnect devices to effectively process higher bandwidth signals even with lower port rates (e.g., support 80 G with 40 G port using 2:1 compression).

The radio unit processing and control module and distributed switch of the present invention supports load balancing and CoMP for wide bandwidth signals employing a large number of antennas. In addition, the radio unit processing and control module and distributed switch of the present invention reduces infrastructure cost (baseband and Radio) by reducing fiber links. The method and apparatus of the present invention allows interconnect devices to effectively process higher bandwidth signals even with lower port rates (e.g., support 80 G with 40 G port using 2:1 compression).

Though the radio unit processing and control module and distributed switch of the present invention is designed for use with next generation architecture that includes load-balancing and pooled baseband, in other embodiments, the radio unit processing and control module and distributed switch is adapted to be used in existing network architectures that do not include load balancing or pooled baseband.

As is known in the art, the radio unit processing and control module and distributed switch architecture may be implemented in a Field Programmable Gate Array (FPGA), an Application-Specific Integrated Circuit (ASIC) or a variety of other commonly known integrated circuit devices. The implementation of the invention may include both hardware and software components.

The invention claimed is:

1. A method for processing data in a baseband unit of a communication system, the method comprising:

receiving compressed data at a baseband unit, the compressed data received from at least one radio unit, wherein the baseband unit is separated from the at least one radio unit;

coupling the compressed data to a switch of the baseband unit;

distributing the compressed data to one of a plurality of network server or storage cards of the baseband unit through the switch when the compressed data is to be stored;

determining if one or more of a plurality of baseband processing cards of the baseband unit are capable of performing decompression of the compressed data;

if one or more of the plurality of baseband processing cards are not capable of performing decompression of the compressed data, running the switch at a first speed to decompress the compressed data at the switch and to distribute the decompressed data to one of the plurality of baseband processing cards of the baseband unit through the switch;

if one or more of the plurality of baseband processing cards are capable of performing decompression of the compressed data, running the switch at a second speed to distribute the compressed data to one of the plurality of baseband processing cards of the baseband unit through the switch, wherein the second speed is lower than the first speed, and decompressing the compressed data at the one of the plurality of baseband processing cards of the baseband unit; and processing the decompressed data at one of the plurality of baseband processing cards.

2. The method of claim 1, wherein the switch is located on one of the plurality of baseband processing cards of the baseband unit.

3. The method of claim 1, wherein the switch is located on one of a plurality of switch cards of the baseband unit.

4. The method of claim 1, further comprising, performing protocol conversion of the compressed data at the switch of the baseband unit.

5. The method of claim 1, further comprising, performing load-balancing of the compressed data through the switch of the baseband unit.

6. A method for processing data in a baseband unit of a communication system, the method comprising:

receiving data at one of a plurality of baseband processing cards of a baseband unit, the data received from a communication backhaul, a network server or a storage device;

processing the received data at one of the plurality of baseband processing cards;

if the received data is to be stored, compressing the received data and distributing the compressed data to one of a plurality of network server or storage cards of the baseband unit through the switch;

determining if one or more of the plurality of baseband processing cards of the baseband unit are capable of performing compression of the received data;

if one or more of the plurality of baseband processing cards of the baseband unit are not capable of performing compression, transmitting the data to the switch, running the switch at a first speed to compress the received data at the switch and to distribute the compressed data to at least one radio unit of the communication system through the switch of the baseband unit, wherein the baseband unit is separated from the at least one radio unit; and if one or more of the plurality of baseband processing cards of the baseband unit are capable of performing compression, compressing the received data at one of the plurality of baseband processing cards, transmitting the compressed data to the switch of the baseband unit and running the switch at a second speed to distribute the compressed data to at least one radio unit of the communication system through the switch of the baseband unit, wherein the baseband unit is separated from the at least one radio unit and wherein the second speed is lower than the first speed.

7. The method of claim 6, wherein the switch is located on one of the plurality of baseband processing cards of the baseband unit.

8. The method of claim 6, wherein the switch is located on one of a plurality of switch cards of the baseband unit.

9. The method of claim 7, further comprising, performing protocol conversion of the compressed data at the switch of the baseband unit.

10. The method of claim 6, further comprising, performing load-balancing of the compressed data through the switch of the baseband unit.

11. An apparatus for processing data in a baseband unit of a communication system, the communication system including at least one baseband unit that includes at least one computation processor for processing decompressed data, and the communication system including at least one radio unit that is separated from the at least one baseband unit, the apparatus comprising:
 a switch of the baseband unit coupled to the at least one computation processor, the switch configured to receive compressed data from at least one radio unit, the switch to distribute the compressed data to one of a plurality of network server or storage cards of the baseband unit through the switch when the compressed data is to be stored and to determine if the at least one computation processor is capable of performing decompression of the compressed data and if the at least one computation processor is not capable of performing decompression of the compressed data,
 the switch configured to run at a first speed to decompress the compressed data at the switch and to distribute the decompressed data through the switch to the at least one computation processor of the baseband unit and,
 if the at least one computation processor is capable of performing decompression of the compressed data, the switch configured to run at a second speed to distribute the compressed data to the at least one computation processor of the baseband unit for decompressing and processing the decompressed data, wherein the second speed is lower than the first speed.

12. The apparatus of claim 11, wherein the baseband unit comprises a plurality of baseband processing cards and the at least one computation processor is located on one of the plurality of baseband processing cards of the baseband unit.

13. The apparatus of claim 11, wherein the switch is located on one of the plurality of baseband processing cards of the baseband unit.

14. The apparatus of claim 11, wherein the baseband band unit comprises a plurality of switch cards and the switch is located on one of the plurality of switch cards of the baseband unit.

15. The apparatus of claim 11, wherein the switch is further configured to perform protocol conversion of the compressed data at the switch of the baseband unit.

16. The apparatus of claim 11, wherein the switch is further configured to perform load-balancing of the compressed data through the switch of the baseband unit.

\* \* \* \* \*